US008587387B2

(12) United States Patent
Lee

(10) Patent No.: US 8,587,387 B2
(45) Date of Patent: Nov. 19, 2013

(54) RF DIRECTIONAL COUPLER CIRCUIT ASSEMBLY FOR MATCHING HIGH FREQUENCY CABLE TV APPARATUS

(75) Inventor: Chien Chung Lee, New Taipei (TW)

(73) Assignee: Cable Vision Electronics Co., Ltd., New Taipei (TW)

( * ) Notice: Subject to any disclaimer, the term of this patent is extended or adjusted under 35 U.S.C. 154(b) by 304 days.

(21) Appl. No.: 13/207,313

(22) Filed: Aug. 10, 2011

(65) Prior Publication Data

US 2012/0278850 A1 Nov. 1, 2012

(30) Foreign Application Priority Data

May 6, 2011 (TW) ............................ 100208157 U

(51) Int. Cl.
*H01P 5/12* (2006.01)
*H03H 7/38* (2006.01)

(52) U.S. Cl.
USPC .......................................... 333/109; 333/112

(58) Field of Classification Search
USPC .................. 333/109, 110, 111, 112, 116, 117
See application file for complete search history.

(56) References Cited

U.S. PATENT DOCUMENTS

| | | | | |
|---|---|---|---|---|
| 5,058,198 | A * | 10/1991 | Rocci et al. | 725/149 |
| 5,828,272 | A * | 10/1998 | Romerein et al. | 333/100 |
| 6,560,778 | B1 * | 5/2003 | Hasegawa | 725/149 |
| 6,570,465 | B2 * | 5/2003 | Tang | 333/109 |

* cited by examiner

*Primary Examiner* — Dean O Takaoka
(74) *Attorney, Agent, or Firm* — Chun-Ming Shih; HDLS IPR Services

(57) ABSTRACT

An RF directional coupler circuit assembly for matching high frequency cable TV apparatus includes a cover body, and a printed circuit board. The cover body includes a space. The space includes a bottom surface. An RF directional coupler circuit is arranged on the printed circuit board. A 0.01 mm~2 mm gap is formed between the RF directional coupler circuit and the bottom surface when the printed circuit board is deposited in the space. The distance between the printed circuit board and the cover body is shorten because of the gap, so that the reflections of the high frequency signals and the signal fading are decreasing to achieve matching high frequency impedance characteristics.

10 Claims, 6 Drawing Sheets

RF DIRECTIONAL COUPLER CIRCUIT ASSEMBLY FOR MATCHING HIGH FREQUENCY CABLE TV APPARATUS

BACKGROUND OF THE INVENTION

1. Field of the Invention

The present invention relates to a high frequency cable TV apparatus, and in particular to an RF directional coupler circuit having improved high frequency (1.0 GHz or above 1.0 GHz) impedance matching with signal taps of high frequency cable TV apparatus.

2. Description of Prior Art

Currently the signals of cable TV are tapped and transmitted by the cable TV apparatus, so that the signals of cable TV are transmitted to different buildings or communities. Accordingly, users in the buildings or communities can watch cable TV programs.

Currently the frequencies of the signals of cable TV are higher and higher (1.0 GHz), so that when the signals of cable TV are transmitted, the signals of cable TV are fading, and the image quality of TV in client sites is worse. The main reason is that the high frequency impedance is not matching.

A conventional cable TV apparatus 10 (as shown in the FIG. 1) includes a cover body 101 having a space 102. A printed circuit board 20 is arranged on a plurality of protruding pillars 103 in the space 102. A long distance 30 is formed between the printed circuit board 20 and the bottom of the space 102. When the high frequency signals are transmitted through an RF directional coupler circuit 201 on the printed circuit board 20, there are a lot of signal reflections because of the distance 30, so that the impedance is not matching, the signals of cable TV have serious fading, and the image quality of TV in clients is worse.

SUMMARY OF THE INVENTION

Therefore, an object of the present invention is to solve the disadvantages of the conventional cable TV apparatus. The present invention is to provide a design shortening the distance between the printed circuit board and the bottom surface of the cover body, for improving high frequency impedance matching for RF directional coupler circuits inside RF directional couplers and signal taps of high frequency cable TV apparatus.

Another object of the present invention is to match a metal plate with the layouts or components on the printed circuit board, to decrease the fading of the transmitted high frequency signals.

In order to achieve the object mentioned above, the present invention is to provide a RF directional coupler circuit assembly for matching high frequency cable TV apparatus. The RF directional coupler circuit assembly for matching high frequency cable TV apparatus includes a cover body, and a printed circuit board.

The cover body includes an edge part. An enclosure wall is provided within the edge part. A joint trough is between the edge part and the enclosure wall. The joint trough is used to assemble the cover body with a base body of the high frequency cable TV apparatus. Besides, a space is defined in the enclosure wall. A plurality of protruding pillars is provided on a bottom surface of the space. Each of the protruding pillars includes a threaded hole. The protruding pillars are used to support the printed circuit board. The printed circuit board is screwed to the threaded holes to be fixed on the protruding pillars. Besides, the edge part includes a plurality of protruding parts. Each of the protruding parts includes a screw bolt for assembling and screwing with the base body of the high frequency cable TV apparatus.

The printed circuit board is disposed in the space. The printed circuit board includes a plurality of through holes. The printed circuit board is disposed on the protruding pillars with a plurality of screws screwing to the threaded holes through the through holes. Besides, an RF directional coupler circuit is on the printed circuit board. After the printed circuit board is disposed on the protruding pillars, a gap is formed between the RF directional coupler circuit on the printed circuit board and the bottom surface of the space.

Moreover, the gap between the bottom surface and the RF directional coupler circuit is 0.01 mm~2 mm. The reflections of the high frequency signals and the signal fading are decreasing to match the high frequency impedance characteristics when the high frequency signals are transmitted.

In order to achieve another object mentioned above, the present invention is to mount a metal plate on the printed circuit board. The metal plate is nearby the RF directional coupler circuit on the printed circuit board, so that the metal plate matches the layouts or components on the printed circuit board, to decrease the fading of the transmitted high frequency signals.

DETAILED DESCRIPTION OF THE INVENTION

Figure 1:
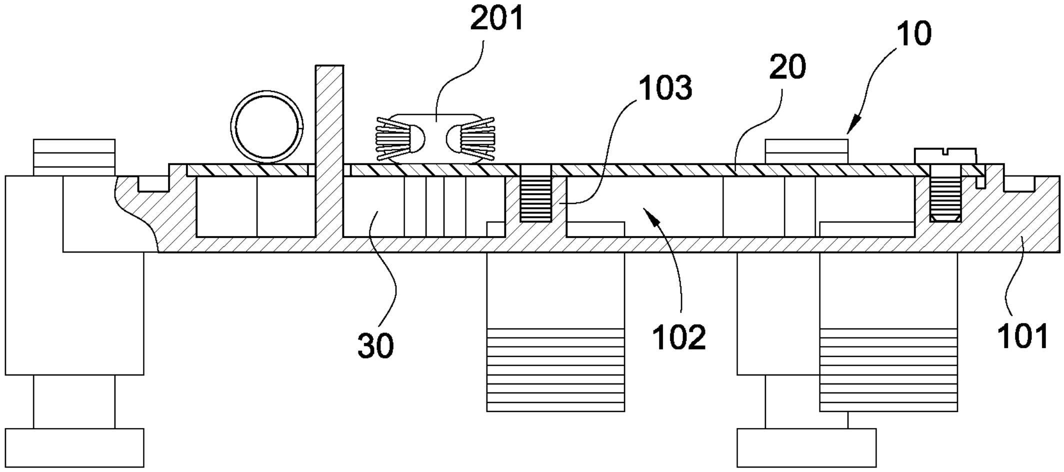
FIG.1 (Prior Art)
FIG. 1 shows a sectional view of a conventional cable TV apparatus.
Figure 2:
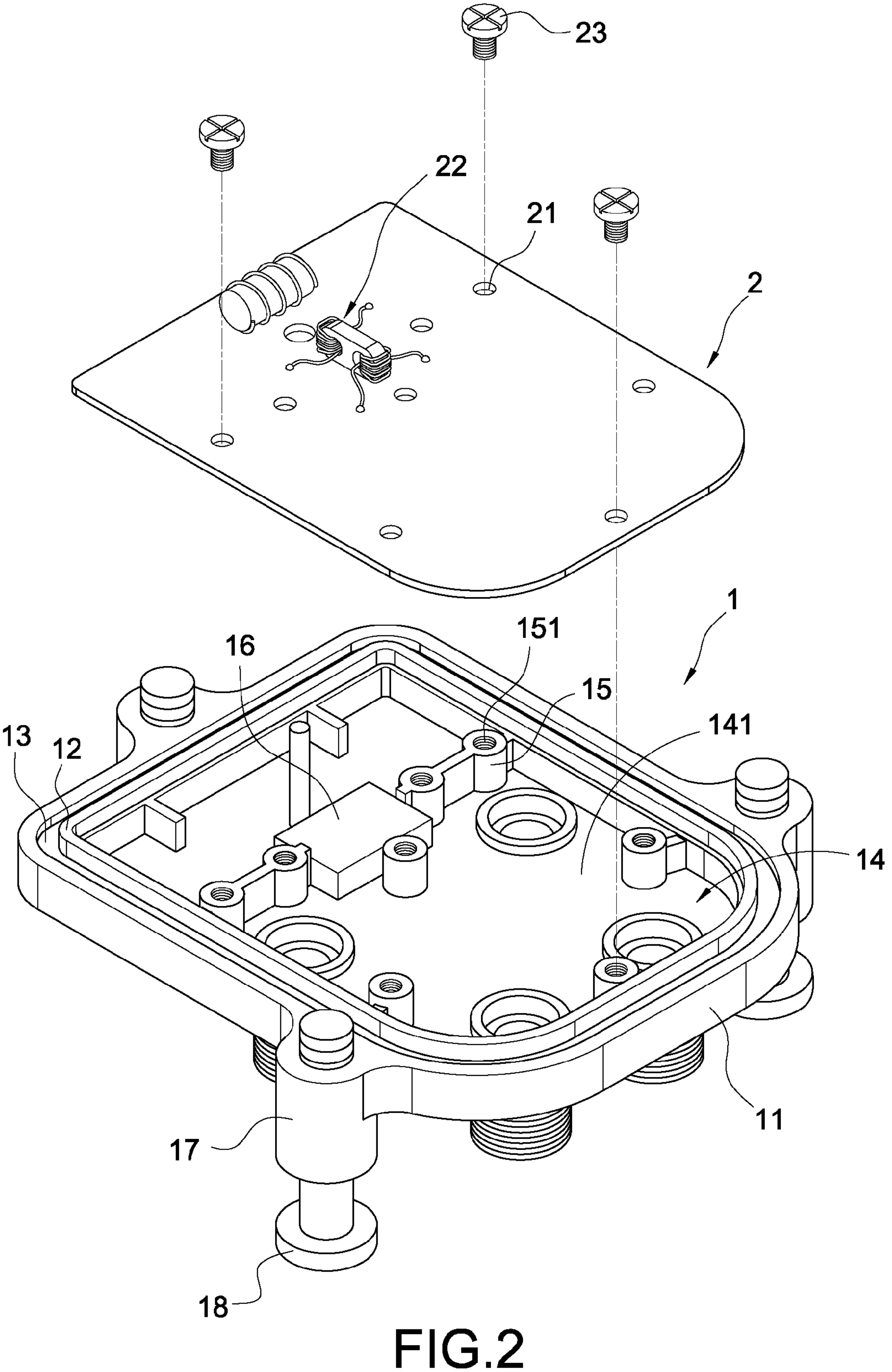
FIG. 2 shows an exploded view of a high frequency cable TV apparatus of the present invention.
Figure 3:
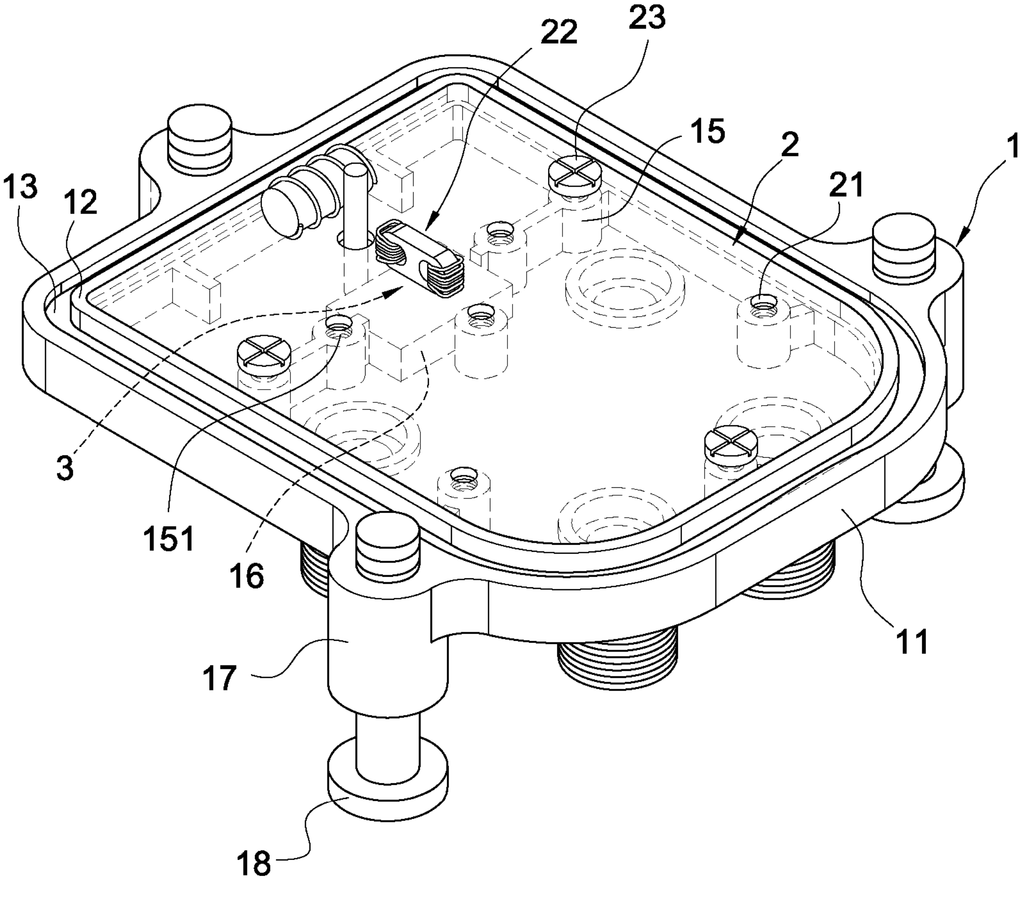
FIG. 3 shows a perspective view of a high frequency cable TV apparatus of the present invention.

Regarding the technology and the detailed description of the present invention, now describe with diagrams as below:

FIG. 2 shows an exploded view of a high frequency cable TV apparatus of the present invention. FIG. 3 shows a perspective view of a high frequency cable TV apparatus of the present invention. As shown in the FIG. 2 and the FIG. 3, the high frequency cable TV apparatus of the present invention includes a cover body 1, and a printed circuit board 2.

The cover body 1 includes an edge part 11. An enclosure wall 12 is provided within the edge part 11. A joint trough 13 is between the edge part 11 and the enclosure wall 12. The joint trough 13 is used to assemble the cover body 1 with a base body of the high frequency cable TV apparatus (not shown in the Fig.). Besides, a space 14 is defined in the enclosure wall 12. A plurality of protruding pillars 15 is provided on a bottom surface 141 of the space 14. Each of the protruding pillars 15 includes a threaded hole 151. The protruding pillars 15 are used to support the printed circuit board 2. The printed circuit board 2 is screwed to the threaded holes 151 such that the printed circuit board 2 is fixed on the protruding pillars 15.

A metal bump 16 is provided on the bottom surface 141 of the space 14. One side of the printed circuit board 2 is closer to the cover body 1 because of the metal bump 16. Besides, the edge part 11 includes a plurality of protruding parts 17. Each of the protruding parts 17 includes a screw bolt 18 for assembling and screwing with the base body of the high frequency cable TV apparatus (not shown in the Fig.).

In the FIG. 2 and the FIG. 3, the metal bump 16 and the cover body 1 are integrally-formed. Or the metal bump 16 and the cover body 1 are separately-formed, but the metal bump 16 could be added into the space 14 of the cover body 1 when the metal bump 16 is required. Moreover, the high frequency cable TV apparatus includes an RF directional coupler and a signal tap.

The input signals of cable TV are processed by the printed circuit board 2, and then transmitted to the next high frequency cable TV apparatus or clients. The printed circuit board 2 includes a plurality of through holes 21. The printed circuit board 2 is disposed on the protruding pillars 15 with a plurality of screws 23, where the screws are screwed to the threaded holes 151 through the through holes 21.

Besides, an RF directional coupler circuit 22 is provided on the printed circuit board 2. After the printed circuit board 2 is disposed on the protruding pillars 15, the RF directional coupler circuit 22 is disposed corresponding to the metal bump 16 in the space 14 to form a gap 3 between the printed circuit board 2 and the metal bump 16. Shortening the distance between the printed circuit board 2 and the cover body 1 (cabinet) will achieve the high frequency impedance matching. In the Fig., the gap 3 is 0.01 mm~2 mm.

Figure 4:
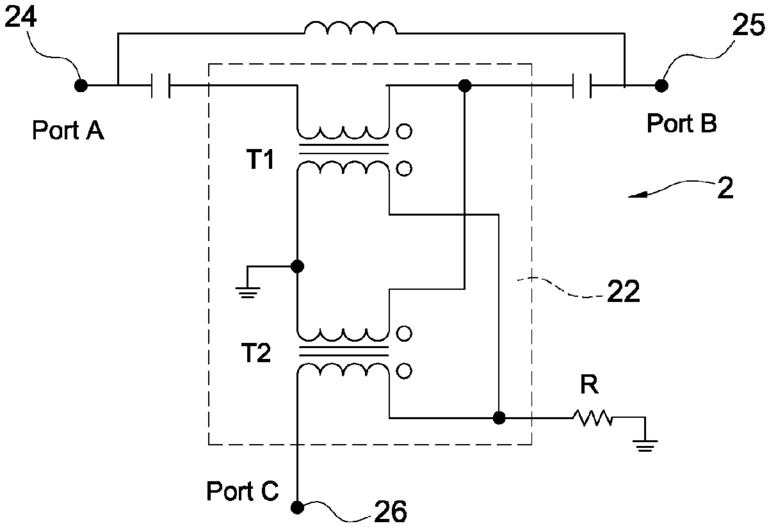
FIG. 4 shows a circuit diagram of the RF directional coupler circuit of the high frequency cable TV apparatus of the present invention.
Figure 5:
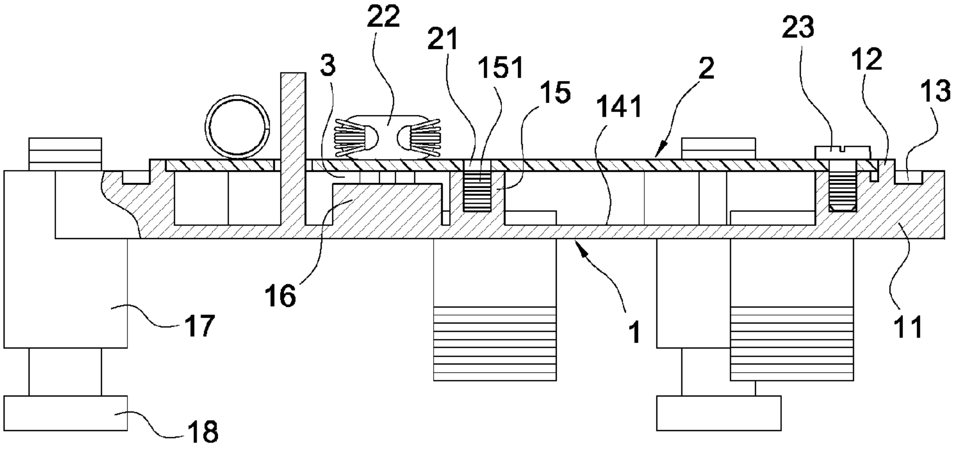
FIG. 5 shows a sectional view of the combination of the cover body and the printed circuit board of the high frequency cable TV apparatus of the present invention.

FIG. 4 shows a circuit diagram of the RF directional coupler circuit of the high frequency cable TV apparatus of the present invention. FIG. 5 shows a sectional view of the combination of the cover body and the printed circuit board of the high frequency cable TV apparatus of the present invention. As shown in the FIG. 4 and the FIG. 5, the RF directional coupler circuit 22 is electrically connected to a first port 24, a second port 25, and a third port 26. After the signals of cable TV are inputted into the first port 24, the signals of cable TV are processed by the RF directional coupler circuit 22, and then outputted from the third port 26 to clients.

Because the printed circuit board 2 is disposed corresponding to the metal bump 16 of the cover body 1, the distance between the printed circuit board 2 and the cover body 1 (cabinet) is shorten, and the reflections of the transmitted signals and the signal fading are decreasing to achieve matching high frequency impedance characteristics when the frequency of the input signal is 1.0 GHz or above 1.0 GHz.

The printed circuit board 2 is fixed on the cover body 1, so that the RF directional coupler circuit 22 of the printed circuit board 2 is corresponding to the metal bump 16 in the space 14 to form the gap 3 between the printed circuit board 2 and the metal bump 16. The high frequency impedance matching could be adjusted by the width of the gap 3. Moreover, the gap 3 could be used for waveguide.

Figure 6:
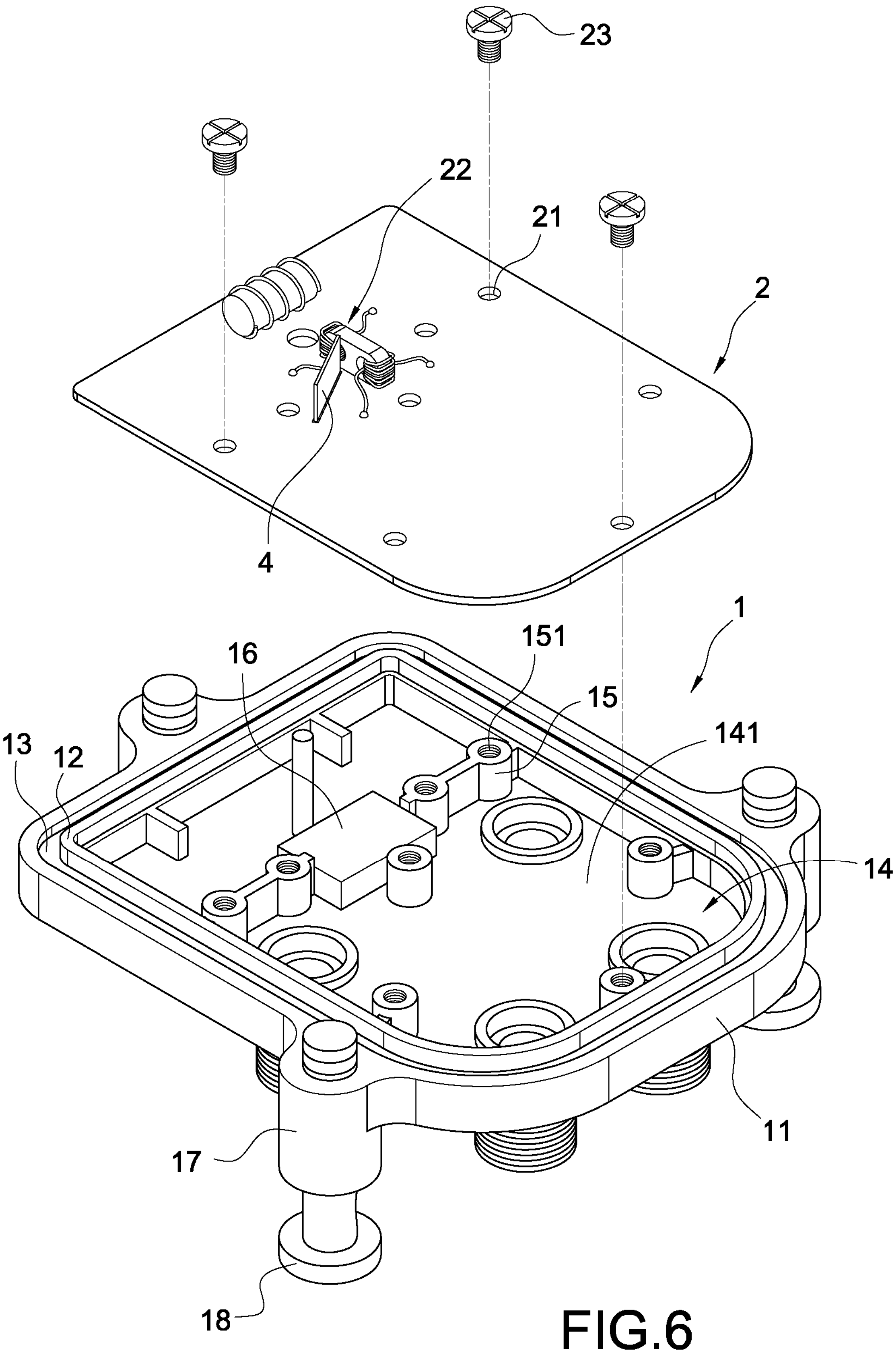
FIG. 6 shows a diagram of another embodiment of the present invention.

FIG. 6 shows a diagram of another embodiment of the present invention. As shown in the FIG. 6, a metal plate 4 is mounted on the printed circuit board 2 and nearby the RF directional coupler circuit 22, so that the metal plate 4 matches the layouts or components on the printed circuit board 2, to decrease the fading of the transmitted high frequency signals.

Figure 7:
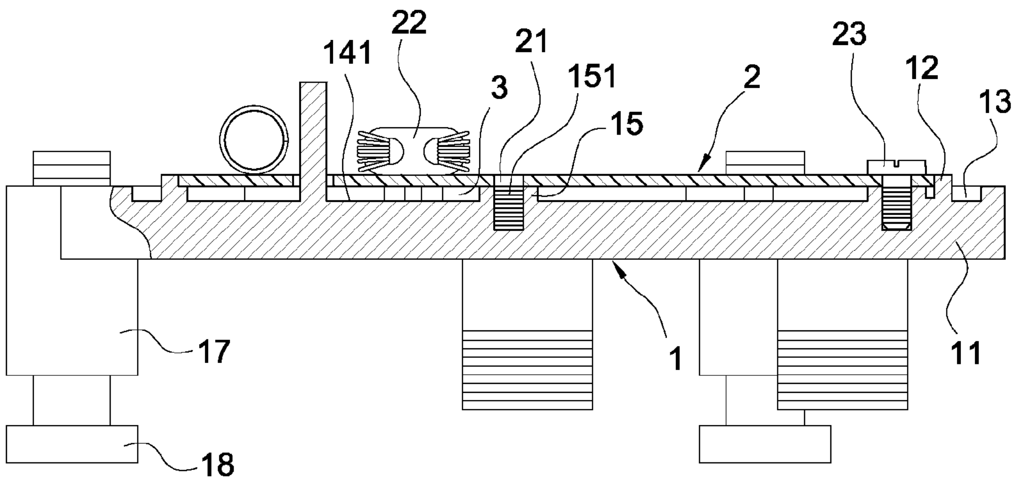
FIG. 7 shows a diagram of another embodiment of the present invention.

FIG. 7 shows a diagram of another embodiment of the present invention. As shown in the FIG. 7, the disclosed technology is similar with FIG. 2 to FIG. 5. The difference is that the bottom surface 141 of the space 14 is higher, so that when the printed circuit board 2 is deposited in the space 14, the distance between the bottom surface 141 of the space 14 and the printed circuit board 2 is shorten. Accordingly, a 0.01 mm~2 mm gap 3 is formed between the RF directional coupler circuit 22 on the printed circuit board 2 and the bottom surface 141 of the space 14. The gap 3 is used to decrease the reflections of the high frequency signals and the signal fading to achieve matching high frequency impedance characteristics when transmitting high frequency signals.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An RF directional coupler circuit assembly for matching high frequency cable TV apparatus including:

a cover body including an enclosure wall, a space defined in the enclosure wall, the space including a bottom surface;

a printed circuit board disposed in the space, an RF directional coupler circuit being on the printed circuit board, a gap being formed between the RF directional coupler circuit and the bottom surface, wherein the gap between the RF directional coupler circuit and the bottom surface is between 0.01 mm and 2 mm to decrease the reflections of the high frequency signals and the signal fading to achieve matching high frequency impedance characteristics when transmitting high frequency signals.

2. The RF directional coupler circuit assembly in claim 1, wherein the cover body further includes an edge part, a joint trough defined between the edge part and the enclosure wall, the joint trough being assembled with a base body of the high frequency cable TV apparatus.

3. The RF directional coupler circuit assembly in claim 2, wherein a plurality of protruding pillars is arranged on the bottom surface of the space, each of the protruding pillars including a threaded hole, the protruding pillars being used to support the printed circuit board, the printed circuit board being screwed to the threaded holes and fixed on the protruding pillars.

4. The RF directional coupler circuit assembly in claim 3, wherein the edge part includes a plurality of protruding parts, each of the protruding parts including a screw bolt for assembling and screwed with the base body of the high frequency cable TV apparatus.

5. The RF directional coupler circuit assembly in claim 4, wherein the printed circuit board includes a plurality of through holes, the printed circuit board being disposed on the protruding pillars with a plurality of screws screwed to the threaded holes through the through holes.

6. The RF directional coupler circuit assembly in claim 5, wherein the gap formed between the RF directional coupler circuit on the printed circuit board and the bottom surface of the space is used as waveguide.

7. The RF directional coupler circuit assembly in claim 6, wherein the high frequency impedance matching is adjusted by a width of the gap.

8. The RF directional coupler circuit assembly in claim 7, wherein a metal plate is mounted on the printed circuit board, so that the metal plate matches the layouts or components on the printed circuit board, to decrease the fading of the transmitted high frequency signals.

9. The RF directional coupler circuit assembly in claim 8, wherein the metal plate mounted on the printed circuit board is adjacent to the RF directional coupler circuit.

10. The RF directional coupler circuit assembly in claim 5, wherein the high frequency cable TV apparatus includes an RF directional coupler and a signal tap.

* * * * *